United States Patent
Ishizaki et al.

(10) Patent No.: US 9,353,299 B2
(45) Date of Patent: May 31, 2016

(54) 2-CYANOACRYLATE-BASED ADHESIVE COMPOSITION

(71) Applicant: TOAGOSEI CO., LTD., Tokyo (JP)

(72) Inventors: Kenichi Ishizaki, Nagoya (JP); Yushi Ando, Nagoya (JP)

(73) Assignee: TOAGOSEI CO., LTD., Tokyo (JP)

( * ) Notice: Subject to any disclaimer, the term of this patent is extended or adjusted under 35 U.S.C. 154(b) by 0 days.

(21) Appl. No.: 14/427,562

(22) PCT Filed: Sep. 6, 2013

(86) PCT No.: PCT/JP2013/074035
§ 371 (c)(1),
(2) Date: Mar. 11, 2015

(87) PCT Pub. No.: WO2014/042082
PCT Pub. Date: Mar. 20, 2014

(65) Prior Publication Data
US 2015/0225627 A1 Aug. 13, 2015

(30) Foreign Application Priority Data

Sep. 11, 2012 (JP) ................................. 2012-199568
Feb. 14, 2013 (JP) ................................. 2013-026621

(51) Int. Cl.
| | |
|---|---|
| *C09J 133/14* | (2006.01) |
| *C09J 11/06* | (2006.01) |
| *C09J 4/00* | (2006.01) |
| *C08F 220/36* | (2006.01) |
| *C08K 5/00* | (2006.01) |
| *G03F 7/039* | (2006.01) |

(52) U.S. Cl.
CPC ...... *C09J 133/14* (2013.01); *C09J 4/00* (2013.01); *C09J 11/06* (2013.01); *C08F 220/36* (2013.01); *C08K 5/00* (2013.01); *G03F 7/039* (2013.01)

(58) Field of Classification Search
CPC ............. C09J 133/14; C09J 11/06; C09J 4/00
USPC ........................................................ 524/556
See application file for complete search history.

(56) References Cited

U.S. PATENT DOCUMENTS

| | | | |
|---|---|---|---|
| 4,108,747 A | 8/1978 | Crivello | |
| 4,171,416 A | 10/1979 | Motegi et al. | |
| 4,460,759 A * | 7/1984 | Robins | C09J 4/00 156/331.2 |
| 4,695,615 A | 9/1987 | Leonard et al. | |
| 4,980,086 A * | 12/1990 | Hiraiwa | C08F 22/32 252/500 |
| 6,204,309 B1 | 3/2001 | Misiak et al. | |
| 6,995,227 B2 | 2/2006 | Ryan et al. | |
| 8,153,743 B2 | 4/2012 | Badejo et al. | |
| 2003/0191248 A1 | 10/2003 | Ryan et al. | |
| 2008/0003196 A1 | 1/2008 | Jonn | |
| 2010/0030258 A1 * | 2/2010 | Badejo | C09J 4/00 606/214 |

FOREIGN PATENT DOCUMENTS

| | | |
|---|---|---|
| EP | 0 080 269 A1 | 6/1983 |
| EP | 2484734 A2 | 8/2012 |
| GB | 2228943 A | 9/1990 |
| JP | S53-129231 A | 11/1978 |
| JP | S60-179482 A | 9/1985 |
| JP | S62-100567 A | 5/1987 |
| JP | S62-235379 A | 10/1987 |
| JP | S63-88152 A | 4/1988 |
| JP | S63-128088 A | 5/1988 |
| JP | H02-115287 A | 4/1990 |
| JP | 2000-044891 A | 2/2000 |
| JP | 2000-073014 A | 3/2000 |
| WO | 98/07801 A1 | 2/1998 |
| WO | 98/18876 A1 | 5/1998 |
| WO | 01/85861 A1 | 11/2001 |
| WO | 2010/014641 A2 | 2/2010 |

OTHER PUBLICATIONS

International Preliminary Report on Patentability issued against PCT/JP2013/074035 on Mar. 17, 2015.
International Search Report dated Dec. 3, 2013, issued in International Application PCT/JP2013/074035.
Extended European Search Report, mailed Jun. 4, 2016, for European Application No. 13836577.0.

* cited by examiner

*Primary Examiner* — Michael M Bernshteyn
(74) *Attorney, Agent, or Firm* — Fitch, Even, Tabin & Flannery LLP

(57) ABSTRACT

A 2-cyanoacrylate-based adhesive composition includes a 2-cyanoacrylic acid ester (a) and an onium salt (b) represented by general formula $C^+A^-$. In the formula, $C^+$ is an onium cation, and $A^-$ is a hydrogen sulfate anion, bisulfite anion, sulfonate anion represented by $R^1SO_3^-$ (where $R^1$ is an alkyl group, perfluoroalkyl group having 3 to 10 carbon atoms, cycloalkyl group, vinyl group, aryl group, perfluoroaryl group, aralkyl group, or halogen atom), or bis(substituted sulfonyl)imide anion represented by $(R^2SO_2)_2N^-$ (where $R^2$ is an alkyl group, perfluoroalkyl group, or aryl group).) The 2-cyanoacrylate-based adhesive composition has good storage stability and has an excellent adhesion rate to metals and thermoplastic elastomers.

7 Claims, No Drawings

2-CYANOACRYLATE-BASED ADHESIVE COMPOSITION

CROSS-REFERENCE TO RELATED APPLICATIONS

This Application is a U.S. National State Application filed under 35 U.S.C. §371 of International Application PCT/JP2013/074035, filed Sep. 6, 2013, designating the United States, which claims priority from Japanese Patent Application 2012-199568, filed Sep. 11, 2012, and Japanese Patent Application 2013-026621, filed Feb. 14, 2013, the complete disclosures of which are hereby incorporated herein reference in their entirety for all purposes.

TECHNICAL FIELD

The present invention relates to a 2-cyanoacrylate-based adhesive composition containing a 2-cyanoacrylic acid ester as the principal component.

BACKGROUND ART

A 2-cyanoacrylate-based adhesive composition quickly establishes a strong bonding among various types of materials based on the unique anion polymerization characteristics exhibited by its principal component, 2-cyanoacrylic acid ester, which initiates polymerization under the presence of weak anion provided by slight moisture or the like attached to a surface of an adherend. Accordingly, it is used as the so-called instantaneous adhesive in a wide range of fields including industrial, medical, and household applications. However, since the setting of the 2-cyanoacrylate-based adhesive composition proceeds by anion polymerization, problems of lowered adhesion rate and insufficient adhesion strength resulting from inhibition of anion polymerization have been found when adherends are made of wood which is acidic or a metal which easily forms an oxide skin. Furthermore, problems of anion polymerization suppression and lowered adhesion rate have been found when adherends are made of a thermoplastic elastomer or the like that is low in polarity. To overcome such problems, various types of additives have been proposed heretofore. For instance, Patent Document 1 discloses an adhesive composition containing crown ethers, and Patent Document 2 discloses an adhesive composition containing polyalkylene oxides. Further, Patent Documents 3 and 4 disclose adhesive compositions containing calixarenes. Furthermore, Patent Document 5 describes using a phase transfer catalyst as a hardening accelerator for the 2-cyanoacrylate-based composition.

CONVENTIONAL TECHNICAL DOCUMENTS

Patent Documents

Patent Document 1: Japanese Patent Publication (Laid-open) No. Sho. 53-129231
Patent Document 2: Japanese Patent Publication (Laid-open) No. Sho. 63-128088
Patent Document 3: Japanese Patent Publication (Laid-open) No. Sho. 60-179482
Patent Document 4: Japanese Patent Publication (Laid-open) No. 2000-44891
Patent Document 5: British Patent Publication GB2228943 specification

SUMMARY OF INVENTION

Problems to be Solved by the Invention

The adhesive compositions disclosed in Patent Documents 1 to 4 have shortened adhesion rate for various adherends, however, with increasing demand on productivity, the adhesion rate is still unsatisfactory when adherends are of metals or thermoplastic elastomers which are low in polarity. Further, even in the case of using the phase transfer catalyst specifically described in Patent Document 5, the adhesion rate is still insufficient when adherends are of metals or thermoplastic elastomers which are low in polarity.

In addition, the adhesive compositions containing crown ethers or polyalkylene oxides as disclosed in Patent Documents 1 and 2 have a problem of clouding when adherends are of EPDM, a methacrylic resin or the like. The adhesive compositions containing calixarene derivatives as disclosed in Patent Documents 3 and 4 also have the problem of producing a clouded hardened body when applied to a soft PVC adherend.

The present invention is made in light of the aforementioned circumstances, and aims at providing an adhesive composition having good storage stability and exhibiting an excellent adhesion rate for metals and thermoplastic elastomers which are low in polarity.

Means for Solving the Problems

The present inventors have found that an adhesive composition having good storage stability and exhibiting an excellent adhesion rate for metals and thermoplastic elastomers which are low in polarity can be obtained by blending an onium salt having a specific structure with a 2-cyanoacrylic acid ester, and have accomplished the present invention.

The present invention is as follows:

1. A 2-cyanoacrylate-based adhesive composition which comprises (a) a 2-cyanoacrylic acid ester and (b) an onium salt represented by the following general formula (1):

$$C^+A^- \qquad (1)$$

wherein $C^+$ represents an onium cation, $A^-$ represents a hydrogen sulfate anion, bisulfite anion, sulfonate anion represented by $R^1SO_3^-$ wherein $R^1$ is an alkyl group, perfluoroalkyl group having 3 to 10 carbon atoms, cycloalkyl group, vinyl group, aryl group, perfluoroaryl group, aralkyl group, or halogen atom; or bis(substituted sulfonyl)imide anion represented by $(R^2SO_2)_2N^-$ wherein $R^2$ is an alkyl group, perfluoroalkyl group, or aryl group.

2. The 2-cyanoacrylate-based adhesive composition according to the above item 1, wherein the cation of the onium salt (b) is at least one onium cation selected from a group consisting of a quaternary ammonium cation, an imidazolium cation, a pyridinium cation, and a tertiary sulfonium cation.

3. The 2-cyanoacrylate-based adhesive composition according to the above item 1 or 2, wherein the anion of the onium salt (b) is at least one of a hydrogen sulfate anion and a bis(perfluoroalkanesulfonyl) imide anion.

4. The 2-cyanoacrylate-based adhesive composition according to the above item 1 or 2, wherein the anion of the onium salt (b) is at least one selected from a group consisting of a hydrogen sulfate anion, a bisulfite anion, a sulfonate anion represented by $R^1SO_3^-$ wherein $R^1$ is an alkyl group, cycloalkyl group, aryl group or aralkyl group.

5. The 2-cyanoacrylate-based adhesive composition according to any of the above items 1 to 4, wherein the content of the onium salt (b) is 10 to 20,000 ppm relative to 100 parts by mass of the 2-cyanoacrylic acid ester (a).

Effect of the Invention

Since the 2-cyanoacrylate-based adhesive composition according to the present invention contains a 2-cyanoacrylic acid ester and an onium salt having a specific structure, it not only exhibits an excellent adhesion rate for metals and thermoplastic elastomers having low polarity, but also has good storage stability. Furthermore, a still higher adhesion rate is exhibited when the anion of the onium salt is at least one of hydrogen sulfate anions and bis(perfluoroalkanesulfonyl) imide anions. In addition, when the anion of the onium salt is at least one selected from the group consisting of hydrogen sulfate anions, bisulfite anions, and sulfonate anions represented by $R^1SO_3^-$ (where $R^1$ represents an alkyl group, cycloalkyl group, aryl group or aralkyl group), it exhibits an excellent adhesion rate without causing clouding of cured products even when used for bonding, filling, or potting of a wide range of base materials.

DESCRIPTION OF EMBODIMENTS

Details of the 2-cyanoacrylate-based adhesive composition (which is hereinafter often simply referred to as "adhesive composition") according to the present invention are described below.

The adhesive composition of the present invention contains a 2-cyanoacrylic acid ester (a) and an onium salt (b) having a specific structure.

As the "2-cyanoacrylic acid ester (a)", 2-cyanoacrylic acid esters generally employed in this type of adhesive compositions can be used without any particular restriction. The 2-cyanoacrylic acid ester includes methyl, ethyl, chloroethyl, n-propyl, i-propyl, allyl, propargyl, n-butyl, i-butyl, n-pentyl, n-hexyl, cyclohexyl, phenyl, tetrahydrofurfuryl, heptyl, 2-ethylhexyl, n-octyl, 2-octyl, n-nonyl, oxononyl, n-decyl, n-dodecyl, methoxyethyl, methoxypropyl, methoxyisopropyl, methoxybutyl, ethoxyethyl, ethoxypropyl, ethoxyisopropyl, propoxymethyl, propoxyethyl, isopropoxyethyl, propoxypropyl, butoxymethyl, butoxyethyl, butoxypropyl, butoxyisopropyl, butoxybutyl, 2,2,2-trifluoroethyl, and hexafluoroisopropyl esters of 2-cyanoacrylic acid. These 2-cyanoacrylic acid esters can be used alone or in combination of two or more. Furthermore, among these 2-cyanoacrylic acid esters, 2-cyanoacrylic acid esters having an alkyl group with 3 or less carbon atoms are preferred since they are excellent in curability, and ethyl 2-cyanoacrylate is more preferred.

The adhesive composition according to the present invention contains "(b) an onium salt represented by the following general formula (1)". The onium salt functions as a hardening accelerator of the adhesive composition, and particularly is a compound which improves the adhesion rate for metals and thermoplastic elastomers.

$$C^+A^- \tag{1}$$

wherein $C^+$ represents an onium cation, $A^-$ represents a hydrogen sulfate anion, bisulfite anion, sulfonate anion represented by $R^1SO_3^-$ (where $R^1$ is an alkyl group, perfluoroalkyl group having 3 to 10 carbon atoms, cycloalkyl group, vinyl group, aryl group, perfluoroaryl group, aralkyl group, or halogen atom), or bis(substituted sulfonyl)imide anion represented by $(R^2SO_2)_2N-$ (where $R^2$ is an alkyl group, perfluoroalkyl group, or aryl group).

The cations of the onium salt include an onium cation represented by the following general formula (2), an imidazolium cation, a pyridinium cation, and an onium cation represented by the following general formula (3).

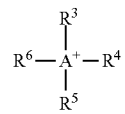

$$R^6-\overset{\overset{\displaystyle R^3}{|}}{\underset{\underset{\displaystyle R^5}{|}}{A^+}}-R^4 \tag{2}$$

wherein $R^3$ to $R^6$ each independently represents a non-substituted or substituted alkyl group having from 1 to 20 carbon atoms, cycloalkyl group, aryl group, aralkyl group, alkenyl group or alkynyl group; otherwise, part or all of $R^3$ to $R^6$ may form a non-substituted or substituted 3 to 10 membered ring together with the atom represented by A wherein the ring may contain a hetero atom such as O and S, provided that $R^3$ to $R^6$ which do not involve the formation of the ring are the same as defined hereinbefore; and A represents a nitrogen atom or phosphorus atom. Specific examples of the above substituted alkyl group include, for example, an alkoxy group and an alkanoyl group. When part of $R^3$ to $R^6$ form a ring, the ring is, in general, constituted by 2 to 3 of $R^3$ to $R^6$. Specific examples of the compound represented by the formula (2) in which two of $R^3$ to $R^6$ form a ring include piperidinium cation, morpholinium cation, and pyrrolidinium cation.

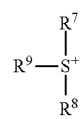

$$R^9-\overset{\overset{\displaystyle R^7}{|}}{\underset{\underset{\displaystyle R^8}{|}}{S^+}} \tag{3}$$

wherein $R^7$ to $R^9$ each independently represents a non-substituted or substituted alkyl group having from 1 to 20 carbon atoms, cycloalkyl group, aryl group, aralkyl group, alkenyl group or alkynyl group; otherwise, part or all of $R^7$ to $R^9$ may form a non-substituted or substituted 3 to 10 membered ring together with the sulfur atom wherein the ring may contain a hetero atom such as O and S, provided that $R^7$ to $R^9$ which do not involve the formation of the ring are the same as defined hereinbefore. Specific examples of the above substituted alkyl group include, for example, an alkoxy group and an alkanoyl group.

Representative examples of the onium cations represented by the formula (2) include quaternary ammonium cations, quaternary phosphonium cations, and the like.

Specific examples of the quaternary ammonium cations include tetraalkylammonium cations such as tetramethylammonium, ethyltrimethylammonium, diethyldimethylammonium, triethylmethylammonium, tetraethylammonium, tetra-n-butylammonium, trimethyl-n-propylammonium, trimethyl-isopropylammonium, n-butyltrimethylammonium, isobutyltrimethylammonium, t-butyltrimethylammonium, n-hexyltrimethylammonium, dimethyldi-n-propylammonium, dimethyldi-isopropylammonium, dimethyl-n-propylisopropylammonium, methyltri-n-propylammonium, methyltri-isopropylammonium, methyldi-n-propylisopropylammonium, methyl-n-propyldiisopropylammonium, triethyl-n-propylammonium, triethylisopropylammonium, n-butyltriethylammonium, triethylisobutylammonium, t-butyltriethylammonium, di-n-butyldimethylammonium, diisobutyldimethylammonium, di-t-butyldimethylammonium, n-butylethyldimethylammonium, isobutylethyldimethylammonium, t-butylethyldimethylammonium, n-butylisobutyldimethylammonium, n-butyl-t-butyldimethylammonium, t-butylisobutyldimethylammonium, diethyldi-n-propylammonium, diethyldiisopropylammonium, diethyl-n-propylisopropylammonium, ethyltri-n-propylammonium, ethyltriisopropylammonium, ethylisopropyldi-n-propylammonium, ethyldiisopropyl-n-propylammonium, diethylmethyl-n-propylammonium, ethyldimethyl-n-propylammonium, ethylmethyldi-n-propylammonium, diethylisopropylmethylammonium, ethylisopropyldimethylammonium, ethyldiisopropylmethylammonium, ethylmethyl-n-propylisopropylammonium, tetra-n-propylammonium, tetra-isopropylammonium, tri-isopropyl-n-propylammonium, diisopropyldi-n-propylammonium, isopropyl-tri-n-propylammonium, butyltrimethylammonium, trimethylpentylammonium, hexyltrimethylammonium, heptyltrimethylammonium, trimethyloctylammonium, trimethylnonylammonium, decyltrimethylammonium, trimethylundecylammonium, dodecyltrimethylammonium, didecyldimethylammonium, dilauryldimethylammonium, dimethyldistyrylammonium, dimethyldioctadecylammonium, dimethyldioctylammonium, dimethyldipalmitylammonium, ethylhexadecyldimethylammonium, hexyldimethyloctylammonium, dodecyl(ferrocenylmethyl)dimethylammonium, N-methyl homatropinium and the like; aromatic alkyl-group substituted ammonium cations such as benzyltrimethylammonium, benzyltributylammonium, benzyldodecyldimethylammonium, and the like; aromatic substituted ammonium cations such as trimethylphenylammonium, tetraphenylammonium, and the like; and aliphatic cyclic ammonium cations such as pyrrolydinium (such as 1,1-dimethylpyrrolydinium, 1-ethyl-1-methylpyrrolydinium, 1,1-diethylpyrrolydinium, 1,1-tetramethylenepyrrolydinium, and 1-butyl-1-methylpyrrolydinium), piperidinium (such as 1,1-dimethylpiperidinium, 1-ethyl-1-methyl piperidinium, 1,1-diethylpiperidinium, and 1-butyl-1-methylpiperidinium), and morpholinium (such as 1,1-dimethylmorpholinium, 1-ethyl-1-methylmorpholinium, and 1,1-diethylmorpholinium).

Specific examples of the quaternary phosphonium cations include cations such as tetramethylphosphonium, triethylmethylphosphonium, and tetraethylphosphonium.

Specific examples of the imidazolium cations include cations such as 1,3-dimethylimidazolium, 1,2,3-trimethylimidazolium, 1-ethyl-3-methylimidazolium, 1-ethyl-2,3-dimethylimidazolium, 1-methyl-3-n-octylimidazolium, 1-hexyl-3-methylimidazolium, 1,3-diethylimidazolium, 1,2-diethyl-3-methylimidazolium, 1,3-diethyl-2-methylimidazolium, 1,2-dimethyl-3-n-propylimidazolium, 1-n-butyl-3-methylimidazolium, 1-n-butyl-2,3-methylimidazolium, 1,2,4-trimethyl3-n-propylimidazolium, 1,2,3,4-tetramethylimidazolium, 1,2,3,4,5-pentamethylimidazolium, 2-ethyl-1,3-dimethylimidazolium, 1,3-dimethyl-2-n-propylimidazolium, 1,3-dimethyl-2-n-pentylimidazolium, 2-n-heptyl-1,3-dimethylimidazolium, 1,3,4-trimethylimidazolium, 2-ethyl-1,3,4-trimethylimidazolium, 1,3-dimethylbenzimidazolium, 3-methyl-1-phenylimidazolium, 1-benzyl-3-methylimidazolium, 2,3-dimethyl-1-phenylimidazolium, 1-benzyl-2,3-dimethylimidazolium, 1,3-dimethyl-2-phenylimidazolium, 2-benzyl-1,3-dimethylimidazolium, 1,3-dimethyl-2-n-undecylimidazolium, and 1,3-dimethyl-2-n-heptadecylimidazolium.

The pyridinium cations include cations such as 1-methylpyridinium, 1-ethylpyridinium, 1-n-propylpyridinium, 1-isopropylpyridinium, 1-n-butylpyridinium, and 1-n-butyl-3-methylpyridinium.

Specific examples of the tertiary sulfonium cations represented by the general formula (3) above include cations such as trimethylsulfonium, triethylsulfonium, tripropylsulfonium, and triphenylsulfonium.

Among the aforementioned onium cations, preferred are quaternary ammonium cations, imidazolium cations, pyridinium cations, or tertiary sulfonium cations from the viewpoint of exhibiting excellent solubility to 2-cyanoacrylic acid ester and good balance between high curing acceleration property and storage stability of the adhesive composition; and further preferred are quaternary ammonium cations, imidazolium cations or pyridinium cations.

The anion of the aforementioned onium salt is a hydrogen sulfate anion, bisulfite anion, sulfonate anion represented by $R^1SO_3^-$ (where $R^1$ is an alkyl group, perfluoroalkyl group having from 3 to 10 carbon atoms, cycloalkyl group, vinyl group, aryl group, perfluoroaryl group, aralkyl group, or halogen atom), or bis(substituted sulfonyl)imide anion represented by $(R^2SO_2)_2N^-$ (where $R^2$ is an alkyl group, perfluoroalkyl group, or aryl group). Preferably, the alkyl group represented by $R^1$ or $R^2$ contains from 1 to 15 carbon atoms.

Specific examples of the aforementioned sulfonate anions represented by $R^1SO_3^-$ include anions such as methanesulfonate, ethanesulfonate, propanesulfonate, hexanesulfonate, heptanesulfonate, octanesulfonate, dodecanesulfonate, vinylsulfonate, benzenesulfonate, p-toluenesulfonate, dodecylbenzenesulfonate, 10-camphorsulfonate, pentafluorobenzenesulfonate, fluorosulfonate, chlorosulfonate, and bromosulfonate. The perfluoroalkylsulfonate anions having from 3 to 10 carbon atoms include perfluorooctanesulfonate anion and the like. The perfluoroalkyl group should have from 3 to 10 carbon atoms, preferably from 4 to 8 carbon atoms, from the viewpoint of solubility of the corresponding onium salt in 2-cyanoacrylic acid ester.

Specific examples of the aforementioned bis(substituted sulfonyl)imide anion represented by $(R^2SO_2)_2N^-$ include bis(methanesulfonyl)imide anion, bis(ethanesulfonyl)imide anion, bis(propanesulfonyl)imide anion, bis(trifluoromethanesulfonyl)imide anion, bis(pentafluoroethanesulfonyl)imide anion, bis(heptafluoropropane sulfonyl)imide anion, and bis(nonafluorobutanesulfonyl)imide anion.

Among these anions, preferred from the viewpoint of exhibiting excellent adhesion rate for metals and thermoplastic elastomers and of imparting superior storage stability to the adhesive composition are hydrogen sulfate anions and bis(perfluoroalkanesulfonyl) imide anions, and more preferred are hydrogen sulfate anions; and also preferred from the viewpoint of exhibiting excellent adhesion rate without causing clouding of cured products even when used for bonding, filling, or potting of a wide range of base materials, are hydrogen sulfate anions, bisulfite anions, and sulfonate anions represented by $R^1SO_3^-$ (where $R^1$ is an alkyl group, cycloalkyl group, aryl group, or aralkyl group).

The onium salt used in the present invention is not particularly limited so long as it is a combination of the cations and the anions described hereinbefore. Specific examples of the onium salts include tetraethylammonium hydrogensulfate, tetra-n-butylammonium hydrogensulfate, methyltri-n-octylammonium hydrogensulfate, amyltriethylammonium hydrogensulfate, cyclohexyltrimethylammonium hydrogensulfate, 1-ethyl-3-methylimidazolium hydrogensulfate, 1-ethyl-2,3-dimethylimidazolium hydrogensulfate, 1-butyl- 3-methylimidazolium hydrogensulfate, 1-butyl-2,3-dimethylimidazolium hydrogensulfate, 1-methyl-3-n-octylimidazolium hydrogensulfate, 1-hexyl-3-methylimidazolium hydrogensulfate, 2-ethyl-1,3-dimethylimidazolium hydrogensulfate, 1,3-dimethyl-2-n-propylimidazolium hydrogensulfate, 1,3-dimethyl-2-n-pentylimidazolium hydrogensulfate, 2-n-heptyl-1,3-dimethylimidazolium hydrogensulfate, 1-ethyl-1-methylpiperidinium hydrogensulfate, 1-butyl-1-methylpiperidinium hydrogensulfate, 1-ethyl-1-methylpyrrolidinium hydrogensulfate, 1-butyl-1-methylpyrrolidinium hydrogensulfate, 1-methyl-1-propylpyrrolidinium hydrogensulfate, 1-ethylpyridinium hydrogensulfate, 1-ethyl-3-methylpyridinium hydrogensulfate, 1-butyl-3-methylpyridinium hydrogensulfate, 1-ethyl-4-methylpyridinium hydrogensulfate, 1-butylpyridinium hydrogensulfate, 1-butyl-4-methylpyridinium hydrogensulfate, tetramethylphosphonium hydrogensulfate, triethylmethylphosphonium hydrogensulfate, tetraethylphosphonium hydrogensulfate, tetra-n-butylammonium methanesulfonate, methyltri-n-octylammonium methanesulfonate, 1-ethyl-3-methylimidazolium methanesulfonate, 1-ethyl-2,3-dimethylimidazolium methanesulfonate, 1-butyl-3-methylimidazolium methanesulfonate, 1-butyl-2,3-dimethylimidazolium methanesulfonate, 1-ethyl-1-methylpiperidinium methanesulfonate, 1-butyl-1-methylpiperidinium methanesulfonate, 1-ethyl-1-methylpyrrolidinium methanesulfonate, 1-butyl-1-methylpyrrolidinium methanesulfonate, 1-methyl-1-propylpyrrolidinium methanesulfonate, 1-ethylpyridinium methanesulfonate, 1-ethyl-3-methylpyridinium methanesulfonate, 1-butyl-3-methylpyridinium methanesulfonate, tetraethylphosphonium methanesulfonate, tetraethylphosphonium methanesulfonate, tetra-n-butylammonium p-toluenesulfonate, methyltri-n-octylammonium p-toluenesulfonate, 1-ethyl-3-methylimidazolium p-toluenesulfonate, 1-ethyl-2,3-dimethylimidazolium p-toluenesulfonate, 1-butyl-3-methylimidazolium p-toluenesulfonate, 1-butyl-2,3-dimethylimidazolium p-toluenesulfonate, 1-ethyl-1-methylpiperidinium p-toluenesulfonate, 1-butyl-1-methylpiperidinium p-toluenesulfonate, 1-ethyl-1-methylpyrrolidinium p-toluenesulfonate, 1-butyl-1-methylpyrrolidinium p-toluenesulfonate, 1-methyl-1-propylpyrrolidinium p-toluenesulfonate, 1-ethylpyridinium p-toluenesulfonate, 1-ethyl-3-methylpyridinium p-toluenesulfonate, 1-butyl-3-methylpyridinium p-toluenesulfonate, tetraethylphosphonium p-toluenesulfonate, tetraethylammonium bis(trifluoromethanesulfonyl)imide, tetra-n-butylammonium bis(trifluoromethanesulfonyl)imide, methyltri-n-octylammonium bis(trifluoromethanesulfonyl)imide, 1-ethyl-3-methylimidazolium bis(trifluoromethanesulfonyl)imide, 1-ethyl-2,3-dimethylimidazolium bis(trifluoromethanesulfonyl)imide, 1-butyl-3-methylimidazolium bis(trifluoromethanesulfonyl)imide, 1-butyl-2,3-dimethylimidazolium bis(trifluoromethanesulfonyl)imide, 1-ethyl-1-methylpiperidinium bis(trifluoromethanesulfonyl)imide, 1-butyl-1-methylpiperidinium bis(trifluoromethanesulfonyl)imide, 1-ethyl-1-methylpyrrolidinium bis(trifluoromethanesulfonyl)imide, 1-butyl-1-methylpyrrolidinium bis(trifluoromethanesulfonyl)imide, 1-methyl-1-propylpyrrolidinium bis(trifluoromethanesulfonyl)imide, 1-ethylpyridinium bis(trifluoromethanesulfonyl)imide, 1-ethyl-3-methylpyridinium bis(trifluoromethanesulfonyl)imide, 1-butyl-3-methylpyridinium bis(trifluoromethanesulfonyl)imide, and triethylsulfonium bis(trifluoromethanesulfonyl)imide.

The onium salt according to the present invention can be obtained by methods known in the art. For instance, they can be prepared from the corresponding onium halides as described in, Hiroyuki Ohno et al., J. Am. Chem. Soc., 2005, 27, 2398-2399; or in Peter Wasserscheid et al., Green Chemistry, 2002, 4, 134-138.

The content of the aforementioned onium salt (b) in the adhesive composition is, preferably from 10 to 20000 ppm, more preferably from 25 to 15000 ppm, and further preferably from 50 to 10000 ppm, per 100 parts by mass of 2-cyanoacrylic acid ester (a). When the content is less than 10 ppm, the effect of hardening acceleration cannot be sufficiently exhibited. On the other hand, if the content exceeds 20000 ppm, the storage stability of the adhesive composition may be impaired.

The reason why the aforementioned onium salt improves the adhesion rate on metals and thermoplastic elastomers without impairing the storage stability of the adhesive composition is not yet clear, however, can be presumed as follows. Since the conjugate acid of the weakly nucleophilic anion that constitutes the onium salt is a strong acid, it releases an anion which is nucleophilic and thus serves as a polymerization initiator of the 2-cyanoacrylic acid ester when it reacts with a salt that is present on a surface of an adherend. On the other hand, since such a salt is not present during storage, the aforementioned anion exchange reaction does not take place to initiate the release of the highly reactive anion, so that excellent storage stability is realized. Particularly, hydrogen sulfates function even as a stabilizer during storage because it is acidic in itself. Furthermore, it is considered that adhesion rate on metals are considerably shortened since hydrogen sulfate ions can dissolve oxides that generate on metal surface and remove them as ions, and at the same time, generate hydroxide ions that are extremely strong polymerization initiators.

The adhesive composition of the present invention may contain, in addition to the aforementioned onium salts, another hardening accelerator conventionally blended in these types of adhesive compositions. Examples of such hardening accelerators include polyalkylene oxides, crown ethers, silacrown ethers, calixarenes, cyclodextrins, and pyrogallol-based cyclic compounds.

The polyalkylene oxides refer to polyalkylene oxides and the derivatives thereof, and examples thereof include those disclosed in Japanese Patent Publication (Kokoku) No. Sho. 60-37836, Japanese Patent Publication (Kokoku) No. Hei. 1-43790, Japanese Patent Publication (Laid-open) No. Sho. 63-128088, Japanese Patent Publication (Laid-open) No. Hei. 3-167279, U.S. Pat. Nos. 4,386,193, and 4,424,327. Concrete examples thereof include (1) polyalkylene oxides such as diethylene glycol, triethylene glycol, polyethylene glycol, and polypropylene glycol; and (2) derivatives of polyalkylene oxides such as polyethylene glycol monoalkyl esters, polyethylene glycol dialkyl esters, polypropylene glycol dialkyl esters, diethylene glycol monoalkyl ethers, diethylene glycol dialkyl ethers, dipropylene glycol monoalkyl ethers, and dipropylene glycol dialkyl ethers.

Examples of the crown ethers include those disclosed in, for instance, Japanese Patent Publication (Kokoku) No. Sho. 55-2238 and Japanese Patent Publication (Laid-Open) No. Hei. 3-167279. Concrete examples thereof include 12-crown-4, 15-crown-5, 18-crown-6, benzo-12-crown-4, benzo-15-crown-5, benzo-18-crown-6, dibenzo-18-crown-6, dibenzo-24-crown-8, dibenzo-30-crown-10, tribenzo-18-crown-6, asym-dibenzo-22-crown-6, dibenzo-14-crown-4, dicyclohexyl-24-crown-8, cyclohexyl-12-crown-4, 1,2-decalyl-15-crown-5, 1,2-naphtho-15-crown-5, 3,4,5-naphthyl-16-crown-5, 1,2-methylbenzo-18-crown-6, 1,2-tert-butyl-18-crown-6, and 1,2-vinylbenzo-15-crown-5. Examples of the silacrown ethers include, for example, those disclosed in Japanese Patent Publication (Laid-Open) No. Sho. 60-168775. Concrete examples thereof include dimethylsila-11-crown-4, dimethylsila-14-crown-5, and dimethylsila-17-crown-6.

Examples of the calixarenes include those disclosed in Japanese Patent Publication (Laid-Open) No. Sho. 60-179482, Japanese Patent Publication (Laid-Open) No. Sho. 62-235379, and Japanese Patent Publication (Laid-Open) No. Sho. 63-88152. Concrete examples thereof include 5,11,17,23,29,35-hexa-tert-butyl-37,38,39,40,41,42-hexahydroxycalix[6]arene, 37,38,39,40,41,42-hexahydroxycalix[6]arene, 37,38,39,40,41,42-hexa-(2-oxo-2-ethoxy)-ethoxycalix[6]arene, 25,26,27,28-tetra-(2-oxo-2-ethoxy)-ethoxycalix[4]arene, and tetraethyl 4-tert-butylcalix[4]arene-O,O',O",O"'-tetraacetate. Examples of the cyclodextrins include those disclosed in Japanese Patent Publication (Kohyo) No. Hei. 5-505835. Concrete examples thereof include α-, β-, or γ-cyclodextrins. Examples of the pyrogallol-based cyclic compounds include compounds disclosed in Japanese Patent Publication (Laid-Open) No. 2000-191600. Concrete examples thereof include 3,4,5,10,11,12,17,18,19,24,25,26-dodecaethoxycarbomethoxy-C-1, C-8, C-15, C-22-tetramethyl[14]-metacyclophane. These hardening accelerators may be used either alone or in combination of two or more thereof.

In the adhesive composition, the content of the hardening accelerators other than the onium salt is preferably from 10 to 30000 ppm, more preferably from 50 to 20000 ppm, and most preferably from 100 to 10000 ppm relative to 100 parts by mass of 2-cyanoacrylic acid ester. The adhesion rate of the adhesive composition can be improved without impairing the storage stability so long as the content falls within the range of from 10 to 30000 ppm.

In addition to the above hardening accelerator, conventionally employed additives for adhesive compositions containing 2-cyanoacrylic acid ester, such as stabilizers, plasticizers, thickeners, particles, colorants, fragrances, solvents, and strength improvers may be added in proper quantities to the adhesive composition of the present invention depending on the objectives, so long as the setting characteristics, adhesion strength or the like of the adhesive composition are not impaired.

The stabilizers include (1) anion polymerization inhibitors, such as sulfur dioxide, aliphatic sulfonates such as methanesulfonate, aromatic sulfonates such as p-toluenesulfonate, boron trifluoride complexes such as boron trifluoride methanol and boron trifluoride diethyl ether, $HBF_4$, and trialkyl borate; and (2) radical polymerization inhibitors such as hydroquinone, hydroquinone monomethyl ether, t-butylcatechol, catechol, and pyrogallol. These stabilizers may be used alone, or in a combination of two or more thereof.

The plasticizers include triethyl acetyl citrate, tributyl acetyl citrate, dimethyl adipate, diethyl adipate, dimethyl sebacate, dimethyl phthalate, diethyl phthalate, dibutyl phthalate, diisodecyl phthalate, dihexyl phthalate, diheptyl phthalate, dioctyl phthalate, bis(2-ethylhexyl) phthalate, diisononyl phthalate, diisotridecyl phthalate, dipentadecyl phthalate, dioctyl terephthalate, diisononyl isophthalate, decyl toluate, bis(2-ethylhexyl) camphorate, 2-ethylhexylcyclohexyl carboxylate, diisobutylfumarate, diisobutylmaleate, caproic triglyceride, 2-ethylhexyl benzoate, and dipropylene glycol dibenzoate. Among them, preferred from the viewpoint of good miscibility with 2-cyanoacrylic acid ester and of high plasticizing efficiency are tributyl acetyl citrate, dimethyl adipate, dimethyl phthalate, 2-ethylhexyl benzoate, and dipropylene glycol dibenzoate. These plasticizers may be used alone or in combination of two or more thereof.

The thickeners include polymethylmethacrylates, copolymers of methylmethacrylate and an acrylate, copolymers of methylmethacrylate and another methacrylate, acrylic rubbers, polyvinylchloride, polystyrene, cellulose esters, polyalkyl-2-cyanoacrylate, and ethylene-vinyl acetate copolymers. These thickeners may be used either alone or in combination of two or more thereof.

EXAMPLES

The present invention is explained in further detail by way of Examples below. However, the present invention is not limited to these Examples without departing from the gist of the present invention. In the description below, parts and percentages are based on mass unless otherwise mentioned.

1. Evaluation Method
(1) Adhesion Rate

The adhesion rate was measured at 23° C. under 60% RH, in accordance with JIS K 6861 "Testing methods for α-cyanoacrylate adhesives". The test pieces used in the measurement were as follows.

Aluminum: Aluminum test piece (material: A1050P), manufactured by Nippon Testpanel Co., Ltd.

Iron: Iron test piece (material: S10C), manufactured by Nippon Testpanel Co., Ltd.

Styrene thermoplastic elastomer: "ACTYMER AE-2060S" (trade name), manufactured by RIKEN TECHNOS CORP.

(2) Viscosity

Viscosity was measured using E-type viscometer at 25° C. and 100 rpm.

(3) Storage Stability

Evaluation was made by comparing the adhesion rate and viscosity measured at the initial stage with the adhesion rate and viscosity measured after storage for one or two weeks under the environment of 50° C. and 95% RH. For the storage, 1.5 g of the adhesive composition was sealed in a 2 g polyethylene container.

(4) Appearance after Cured

Several drops of the adhesive were placed on 3 mm×25 mm×50 mm EPDM (ethylene propylene rubber) and soft PVC (polyvinyl chloride) plates, and were allowed to set under the environment of 23° C. and 60% RH for 3 days. The appearance of the hardened body was observed and indicated by "o" or "x". "o" indicates that no clouding or wrinkle was observed on the hardened body, whereas "x" indicates that clouding or wrinkle was observed on the hardened body. The test pieces used were as follows.

EPDM: EPDM-5065/3t, manufactured by CHU-KYOGOMU CORPORATION,

Soft PVC: TOUGHNYL D-Blue (trade name), manufactured by Japan Wavelock Co., Ltd.

2. Synthesis of Onium Salt

Synthesis Example 1

1-butyl-2,3-dimethylimidazolium hydrogensulfate

In a 50-ml eggplant shape flask were charged 1.887 g (10.00 mmol) of 1-butyl-2,3-dimethylimidazolium chloride (see Table 1), 13.2 g (20 mg chemical equivalent) of anion exchange resin (AMBERLITE IRA900A OH AG (trade name), strong base type, manufactured by Organo Corporation), and 25 ml of ion-exchange water, and were stirred for 48 hours under room temperature. After filtering off the ion exchange resin, 2.002 g (10.00 mmol) of 49% aqueous sulfuric acid solution was dropped into the resulting product under ice cooling. The ice bath was removed, and additional stirring was continued for 12 hours under room temperature. Then, after rinsing with 25 ml of toluene, the resulting product was purified with ion exchange resin and condensed under reduced pressure. The thus-obtained residue was dissolved in 25 ml of methanol to filter off the insoluble matter. The solvent was distilled away to obtain 2.203 g of pale yellow oil.

Synthesis Examples 2 to 4

Onium salts were synthesized in the same manner as in Synthesis Example 1, except that the starting materials and the amount were changed as indicated in Table 1.

Synthesis Example 5

Dimethyldioctylammonium Hydrogensulfate

In a 100-ml eggplant shape flask were charged 2.103 g (3.33 mmol) of dimethyldioctylammonium bromide)(see Table 1), 4.40 g (6.70 mg chemical equivalent) of anion exchange resin (AMBERLITE IRA900A OH AG, strong base type, manufactured by Organo Corporation), and 50 ml of methanol. The resulting mixture was stirred for 48 hours under room temperature. After filtering off the ion exchange resin and exchanging the solvent with 15 ml of toluene, 0.667 g (3.33 mmol) of 49% aqueous sulfuric acid solution was dropped into the resulting product while ice-cooling the solvent. The ice bath was removed, and additional stirring was continued for 12 hours under room temperature. Then, after adding 10 ml of ion exchange water and rinsing three times, the resulting product was dried on anhydrous magnesium sulfate. After the solvent was condensed under reduced pressure, the thus-obtained residue was dissolved again in 25 ml of methanol to filter off the insoluble matter. The solvent was distilled away again to obtain 2.278 g of white solid.

TABLE 1

| Synthesis Example | Onium Salt Type | Yield (g) | Compound | Charged Amount (g) |
|---|---|---|---|---|
| 1 | A | 2.303 | 1-butyl-2,3-dimethyl-imidazolium chloride | 1.887 |
| 2 | B | 2.349 | 1-butyl-3-methyl-pyridinium bromide | 2.302 |
| 3 | C | 2.382 | 1-butyl-1-methyl-piperidinium bromide | 2.362 |
| 4 | D | 2.250 | 1-butyl-1-methyl-pyrrolidinium bromide | 2.222 |
| 5 | E | 2.228 | dimethyldioctyl-ammonium bromide | 2.103 |

3. Preparation of 2-cyanoacrylate-based adhesive composition

Example 1

To ethyl 2-cyanocrylate were added 20 ppm of sulfur dioxide and 1000 ppm of hydroquinone (with respect to 100 parts by mass of ethyl 2-cyanocrylate), and 100 ppm of 1-butyl-2,3-dimethylimidazolium hydrogensulfate was blended therewith. The resulting blend was stirred to mix for 30 minutes under room temperature (15 to 30° C.) to produce an adhesive composition. The thus-obtained adhesive composition was subjected to evaluation to obtain the adhesion rate on aluminum and iron, viscosity, and storage stability. The results are given in Table 2.

Examples 2 to 13 and Comparative Examples 1 to 5

Adhesive compositions were produced and evaluated in the same manner as in Example 1, except that the onium salt or hardening accelerator to be blended with the adhesive compositions was changed as shown in Tables 2 and 3. The results are given in Tables 2 and 3.

Example 14

To ethyl 2-cyanocrylate were added 20 ppm of sulfur dioxide and 1000 ppm of hydroquinone (with respect to 100 parts by mass of ethyl 2-cyanocrylate), and 500 ppm of 1-butyl-2,3-dimethylimidazolium hydrogensulfate was blended therewith. The resulting blend was stirred to mix for 30 minutes under room temperature (15 to 30° C.) to produce the adhesive composition. The thus-obtained adhesive composition was subjected to evaluation to obtain the adhesion rate to thermoplastic elastomer, viscosity, and storage stability. The results are given in Table 4.

Examples 15 to 22 and Comparative Examples 6 to 8

Adhesive compositions were produced and evaluated in the same manner as in Example 14, except that the onium salt or additive to be blended with the adhesive compositions was changed as shown in Table 4. The results are given in Table 4.

TABLE 2

| | | Onium salt | | | Initial | | | After 2 weeks (50° C., 95% RH) | | |
|---|---|---|---|---|---|---|---|---|---|---|
| | | | | | Adhesion rate (seconds) | | | Adhesion rate (seconds) | | |
| | | Type | | Content (ppm) | Aluminum | Iron | Viscosity (mPa·s) | Aluminum | Iron | Viscosity (mPa·s) |
| Example | 1 | 1-butyl-2,3-dimethylimidazolium hydrogensulfate | A | 100 | 3 | 5 | 2.3 | 5 | 5 | 2.8 |
| | 2 | 1-butyl-2,3-dimethylimidazolium hydrogensulfate | A | 500 | 3 | 1 | 2.4 | 3 | 3 | 3.1 |

TABLE 2-continued

| | | Onium salt | | | Initial | | | After 2 weeks (50° C., 95% RH) | | |
| | | | | | Adhesion rate (seconds) | | | Adhesion rate (seconds) | | |
| | Type | | Content (ppm) | Aluminum | Iron | Viscosity (mPa·s) | Aluminum | Iron | Viscosity (mPa·s) |
|---|---|---|---|---|---|---|---|---|---|
| 3 | 1-butyl-3-methylpyridinium hydrogensulfate | B | 125 | 1 | 1 | 1.9 | 3 | 1 | 2.9 |
| 4 | 1-butyl-3-methylpyridinium hydrogensulfate | B | 150 | 1 | 1 | 2.0 | 3 | 1 | 3.8 |
| 5 | 1-butyl-1-methylpiperidinium hydrogensulfate | C | 100 | 1 | 5 | 2.1 | 1 | 3 | 3.0 |
| 6 | 1-butyl-1-methylpyrrolidinium hydrogensulfate | D | 100 | 1 | 5 | 2.1 | 3 | 5 | 2.9 |
| 7 | 1-ethyl-3-methylimidazolium hydrogensulfate | Merck Reagent | 100 | 3 | 3 | 2.0 | 3 | 3 | 2.1 |
| 8 | 1-ethyl-3-methylimidazolium hydrogensulfate | Merck Reagent | 150 | 3 | 3 | 2.3 | 3 | 1 | 3.7 |
| 9 | 1-butyl-3-methylimidazolium hydrogensulfate | Merck Reagent | 150 | 3 | 1 | 2.1 | 3 | 1 | 2.9 |
| 10 | 1-butyl-3-methylimidazolium hydrogensulfate | Merck Reagent | 200 | 3 | 1 | 2.6 | 3 | 1 | 3.3 |
| 11 | 1-butyl-3-methylimidazolium hydrogensulfate | Merck Reagent | 300 | 3 | 1 | 2.6 | 3 | 1 | 4.4 |
| 12 | tetra-n-butylammonium hydrogensulfate | Merck Reagent | 100 | 3 | 3 | 2.2 | 3 | 3 | 2.7 |
| 13 | triethylsulfonium bis(trifluoromethane-sulfonyl)imide | Reagent, Tokyo Chemical Industry Co., Ltd. | 10000 | 5 | 5 | 5.7 | 5 | 5 | 5.6 |

TABLE 3

| | | Additive | | | Initial | | | After 2 weeks (50° C., 95% RH) | | |
| | | | | | Adhesion rate (seconds) | | | Adhesion rate (seconds) | | |
| | | Type | Trade name | Content (ppm) | Aluminum | Iron | Viscosity (mPa·s) | Aluminum | Iron | Viscosity (mPa·s) |
|---|---|---|---|---|---|---|---|---|---|---|
| Comparative Example | 1 | 15-Crown-5 | Crown Ether O-15, manufactured by NIPPON SODA CO., LTD. | 2500 | 10 | 10 | 2.1 | 10 | 10 | 2.5 |
| | 2 | 18-Crown-6 | Reagent, Kishida Chemical Co., Ltd. | 500 | 10 | 10 | 2.1 | 10 | 10 | 3.7 |
| | 3 | Tetraethyl 4-tert-Butylcalix[4]arene-O,O',O'',O'''-tetraacetate | CALIX B4-EA, manufactured by Sugai Chemical IND. CO., LTD. | 2000 | 10 | 10 | 2.2 | 15 | 15 | 2.5 |
| | 4 | 1-Ethyl-3-methylimidazolium Trifluoromethane-sulfonate | Reagent, Tokyo Chemical Industry Co., Ltd. | 1000 | 10 | 10 | 2.5 | 10 | 10 | 3.6 |
| | 5 | Additive-free | — | — | 15 | 15 | 2.1 | 15 | 20 | 2.1 |

TABLE 4

| | | Onium Salt or Additives | | | Initial | | After 1 week (50° C., 95% RH) | |
|---|---|---|---|---|---|---|---|---|
| | | Type | | Content (ppm) | Adhesion rate on thermoplastic elastomer (seconds) | Viscosity (mPa·s) | Adhesion rate on thermoplastic elastomer (seconds) | Viscosity (mPa·s) |
| Examples | 14 | 1-butyl-2,3-dimethylimidazolium hydrogensulfate | A | 500 | 10 | 2.4 | 15 | 2.7 |
| | 15 | 1-butyl-3-methylpyridinium hydrogensulfate | B | 150 | 20 | 2.0 | 30 | 3.0 |
| | 16 | 1-butyl-1-methylpiperidinium hydrogensulfate | C | 100 | 10 | 2.1 | 15 | 2.5 |
| | 17 | 1-butyl-1-methylpyrrolidinium hydrogensulfate | D | 100 | 20 | 2.1 | 20 | 2.5 |
| | 18 | 1-butyl-3-methylimidazolium hydrogensulfate | Merck Reagent | 150 | 10 | 2.1 | 10 | 2.7 |
| | 19 | tetra-n-butylammonium hydrogensulfate | Merck Reagent | 100 | 20 | 2.2 | 30 | 2.4 |
| | 20 | 1-butyl-3-methylimidazolium bis(trifluoromethanesulfonyl)imide | Reagent, Tokyo Chemical Industry Co., Ltd. | 500 | 20 | 2.2 | 30 | 2.8 |
| | 21 | methyltri-n-octylammonium bis(trifluoromethanesulfonyl)imide | Reagent, Tokyo Chemical Industry Co., Ltd. | 500 | 20 | 2.2 | 30 | 2.9 |
| | 22 | triethylsulfonium bis(trifluoromethanesulfonyl)imide | Reagent, Tokyo Chemical Industry Co., Ltd. | 10000 | 20 | 5.7 | 30 | 5.7 |
| Comparative Examples | 6 | 15-Crown-5 | Crown Ether O-15, manufactured by NIPPON SODA CO., LTD. | 2500 | 90 | 2.1 | 120 | 2.3 |
| | 7 | Tetraethyl 4-tert-Butylcalix[4]arene-O,O',O'',O'''-tetraacetate | CALIX B4-EA, manufactured by Sugai Chemical IND. CO., LTD. | 2000 | 120 | 2.2 | 180 | 2.4 |
| | 8 | Additive-free | — | — | 300 | 2.1 | >300 | 2.1 |

Referring to the results shown in Tables 2 and 3, the adhesive compositions obtained in Examples 1 to 13 exhibit superior adhesion rate on aluminum or iron as compared with the adhesive compositions blended with conventional hardening accelerators (Comparative Examples 1 to 3) and the adhesive composition containing an onium salt that falls out of the scope of the present invention (Comparative Example 4). Furthermore, it is also understood that they are excellent in storage stability because the change in viscosity after 2 weeks under 50° C. and 95% RH is within twice the initial value.

Further according to the results shown in Table 4, the adhesive compositions obtained in Examples 14 to 22 exhibit excellent adhesion rate on thermoplastic elastomer as compared with the adhesive compositions containing conventional hardening accelerators (Comparative Examples 6 and 7). Furthermore, it is also understood that they are excellent in storage stability because the change in viscosity after 1 weeks under 50° C. and 95% RH is within one half times the initial value.

Example 23

To ethyl 2-cyanoacrylate were added 20 ppm of sulfur dioxide and 1000 ppm of hydroquinone (with respect to 100 parts mass of ethyl 2-cyanoacrylate), and 150 ppm of 1-butyl-3-methylpyridinium hydrogensulfate (the onium salt "B" in Table 1) was blended therewith. The resulting blend was stirred to mix for 30 minutes under room temperature (15 to 30° C.) to produce an adhesive composition. The thus-obtained adhesive composition was subjected to evaluation to obtain the adhesion rate on aluminum, iron, and thermoplastic elastomer and appearance of cured body. The results are given in Table 5.

Examples 24 to 34 and Comparative Examples 9 to 14

Adhesive compositions were produced and evaluated in the same manner as in Example 23, except that the onium salt or hardening accelerator to be blended with the adhesive compositions was changed as shown in Tables 5 and 6. The results are given in Tables 5 and 6.

TABLE 5

| | | Onium Salt | | | Adhesion rate (seconds) | | | Appearance after cured | |
|---|---|---|---|---|---|---|---|---|---|
| | | Type | Content (ppm) | Aluminum | Iron | Thermoplastic Elastomer | On EPDM | On Soft PVC |
| Examples | 23 | 1-butyl-3-methylpyridinium hydrogensulfate | B | 150 | 1 | 1 | 15 | ○ | ○ |
| | 24 | 1-butyl-1-methylpyrrolidinium hydrogensulfate | D | 100 | 1 | 5 | 20 | ○ | ○ |
| | 25 | 1-ethyl-3-methylimidazolium hydrogensulfate | Merck Reagent | 100 | 3 | 3 | 10 | ○ | ○ |
| | 26 | 1-ethyl-3-methylimidazolium hydrogensulfate | Merck Reagent | 150 | 3 | 3 | 10 | ○ | ○ |
| | 27 | 1-ethyl-3-methylimidazolium hydrogensulfate | Merck Reagent | 1000 | 1 | 1 | 10 | ○ | ○ |
| | 28 | 1-ethyl-3-methylimidazolium hydrogensulfate | Merck Reagent | 10000 | 3 | 3 | 15 | ○ | ○ |
| | 29 | 1-butyl-3-methylimidazolium hydrogensulfate | Merck Reagent | 150 | 3 | 1 | 10 | ○ | ○ |
| | 30 | 1-butyl-3-methylimidazolium hydrogensulfate | Merck Reagent | 200 | 3 | 1 | 7 | ○ | ○ |
| | 31 | 1-butyl-3-methylimidazolium hydrogensulfate | Merck Reagent | 300 | 3 | 1 | 7 | ○ | ○ |
| | 32 | tetra-n-butylammonium hydrogensulfate | Merck Reagent | 100 | 3 | 3 | 30 | ○ | ○ |
| | 33 | 1-ethyl-3-methylimidazolium methanesulfonate | Reagent, Tokyo Chemical Industry Co., Ltd. | 500 | 5 | 5 | 30 | ○ | ○ |
| | 34 | dimethyldioctylammonium hydrogensulfate | E | 500 | 3 | 5 | 15 | ○ | ○ |

TABLE 6

| | | Additive | | | Adhesion rate (seconds) | | | Appearance after cured | |
|---|---|---|---|---|---|---|---|---|---|
| | | Type | Trade name | Content (ppm) | Aluminum | Iron | Thermoplastic Elastomer | On EPDM | On Soft PVC |
| Comparative Examples | 9 | 15-Crown-5 | Crown Ether O-15, manufactured by NIPPON SODA CO., LTD. | 2500 | 10 | 10 | 90 | x | x |
| | 10 | Tetraethyl 4-tert-butylcalix[4]arene-O,O',O'',O'''-tetraacetate | CALIX B4-EA, manufactured by Sugai Chemical IND. CO., LTD. | 2000 | 10 | 10 | 120 | ○ | x |
| | 11 | 1-Ethyl-3-methylimidazolium trifluoromethanesulfonate | Reagent, Tokyo Chemical Industry Co., Ltd. | 1000 | 10 | 10 | 15 | x | x |
| | 12 | Tetra-n-butylammonium tetrafluoroborate | Reagent, Tokyo Chemical Industry Co., Ltd. | 500 | 10 | 10 | 120 | ○ | ○ |
| | 13 | Tetra-n-butylammonium hexafluorophosphate | Reagent, Tokyo Chemical Industry Co., Ltd. | 500 | 10 | 10 | 120 | x | x |
| | 14 | Additive-free | — | — | 15 | 15 | 300 | x | x |

Referring to the results shown in Tables 5 and 6, the adhesive compositions obtained in Examples 23 to 34 exhibit superior adhesion rate on aluminum, iron and thermoplastic elastomer that is low in polarity, as compared with the adhesive compositions blended with conventional hardening accelerators (Comparative Examples 9 and 10) and the adhesive compositions containing the onium salt that falls out of the scope of the present invention (Comparative Examples 11 to 13). Also, it is understood that they are excellent in appearance after cured on both base materials of EPDM and soft PVC.

INDUSTRIAL APPLICABILITY

The present invention which is based on 2-cyanoacrylic acid ester can be utilized as a so-called instantaneous adhesive in a wide range of products and technical fields in various types of industrial fields including household and medical fields. It is particularly useful for an application that requires metals to be bonded in a short time.

The invention claimed is:

1. A 2-cyanoacrylate-based adhesive composition which comprises (a) a 2-cyanoacrylic acid ester and (b) an onium salt represented by the following general formula (1):

$$C^+A^- \quad (1)$$

wherein
  $C^+$ represents an onium cation, and
  $A^-$ represents a hydrogen sulfate anion, bisulfite anion, sulfonate anion represented by $R^1SO_3^-$ wherein $R^1$ is an alkyl group, perfluoroalkyl group having 3 to 10 carbon atoms, cycloalkyl group, vinyl group, aryl group, perfluoroaryl group, aralkyl group, or halogen atom, or bis(substituted sulfonyl)imide anion represented by $(R^2SO_2)_2N^-$ wherein $R^2$ is an alkyl group, perfluoroalkyl group, or aryl group.

2. The 2-cyanoacrylate-based adhesive composition according to claim 1, wherein the cation of the onium salt (b) is at least one onium cation selected from the group consisting of a quaternary ammonium cation, an imidazolium cation, a pyridinium cation, and a tertiary sulfonium cation.

3. The 2-cyanoacrylate-based adhesive composition according to claim 1, wherein the anion of the onium salt (b) is at least one of a hydrogen sulfate anion and a bis(perfluoroalkanesulfonyl)imide anion.

4. The 2-cyanoacrylate-based adhesive composition according to claim 1, wherein the anion of the onium salt (b) is at least one selected from the group consisting of a hydrogen sulfate anion, a bisulfite anion, and a sulfonate anion represented by $R^1SO_3^-$ wherein $R^1$ is an alkyl group, cycloalkyl group, aryl group or aralkyl group.

5. The 2-cyanoacrylate-based adhesive composition according to claim 1, wherein the content of the onium salt (b) is 10 to 20,000 ppm relative to 100 parts by mass of the 2-cyanoacrylic acid ester (a).

6. The 2-cyanoacrylate-based adhesive composition according to claim 2, wherein the anion of the onium salt (b) is at least one of a hydrogen sulfate anion and a bis(perfluoroalkanesulfonyl)imide anion.

7. The 2-cyanoacrylate-based adhesive composition according to claim 2, wherein the anion of the onium salt (b) is at least one selected from the group consisting of a hydrogen sulfate anion, a bisulfite anion, and a sulfonate anion represented by $R^1SO_3^-$ wherein $R^1$ is an alkyl group, cycloalkyl group, aryl group or aralkyl group.

* * * * *